United States Patent
Kapusta et al.

(10) Patent No.: US 7,952,187 B2
(45) Date of Patent: May 31, 2011

(54) SYSTEM AND METHOD OF FORMING A WAFER SCALE PACKAGE

(75) Inventors: Christopher James Kapusta, Delanson, NY (US); Donald Cunningham, Dallas, TX (US); Richard Joseph Saia, Niskayuna, NY (US); Kevin Durocher, Waterford, NY (US); Joseph Iannotti, Glenville, NY (US); William Hawkins, Rexford, NY (US)

(73) Assignee: General Electric Company, Schenectady, NY (US)

( * ) Notice: Subject to any disclaimer, the term of this patent is extended or adjusted under 35 U.S.C. 154(b) by 278 days.

(21) Appl. No.: 12/059,075

(22) Filed: Mar. 31, 2008

(65) Prior Publication Data

US 2009/0243081 A1 Oct. 1, 2009

(51) Int. Cl.
*H01L 29/34* (2006.01)
*H01L 23/48* (2006.01)

(52) U.S. Cl. ........ 257/700; 257/678; 257/710; 257/723; 257/E21.508; 257/E23.021; 257/E23.178; 438/106; 438/107; 438/110; 438/118

(58) Field of Classification Search .................. 257/678, 257/700, 710, 723, E21.508, E23.021, E23.178; 438/106, 107, 110, 118
See application file for complete search history.

(56) References Cited

U.S. PATENT DOCUMENTS

| | | | |
|---|---|---|---|
| 5,366,906 A | 11/1994 | Wojnarowski et al. | |
| 5,757,072 A * | 5/1998 | Gorowitz et al. | 257/700 |
| 6,767,764 B2 * | 7/2004 | Saia et al. | 438/118 |
| 7,189,594 B2 * | 3/2007 | Kripesh et al. | 438/107 |
| 2004/0063249 A1 * | 4/2004 | Lin et al. | 438/110 |

* cited by examiner

*Primary Examiner* — Dao H Nguyen
(74) *Attorney, Agent, or Firm* — Ziolkowski Patent Solutions Group, SC; Jean K. Testa (57) ABSTRACT

A system and method for forming a wafer level package (WLP) (i.e., wafer level chip size package) is disclosed. The WLP includes a silicon integrated circuit (IC) substrate having a plurality of die pads formed on a top surface thereof and a plurality of polymer laminates positioned thereon. Each of the polymer laminates is comprised of a separate pre-formed laminate sheet and has a plurality of vias formed therein that correspond to a respective die pad. A plurality of metal interconnects are formed on each of the plurality of polymer laminates so as to cover a portion of a top surface of a polymer laminate and extend down through the via and into contact with a metal interconnect on a neighboring polymer laminate positioned below. An input/output (I/O) system interconnect is positioned on a top surface of the wafer level package and is attached to the plurality of metal interconnects.

23 Claims, 7 Drawing Sheets

SYSTEM AND METHOD OF FORMING A WAFER SCALE PACKAGE

BACKGROUND OF THE INVENTION

Embodiments of the invention relate generally to integrated circuit packages and, more particularly, to wafer level packages for integrated circuits. Wafer level packages are manufactured using laminated re-distribution layers and high density interconnects.

As integrated circuits become increasingly smaller and yield better operating performance, packaging technology for integrated circuit (IC) packaging has correspondingly evolved from leaded packaging to laminated-based ball grid array (BGA) packaging and eventually to chip scale packaging (CSP). Advancements in IC chip packaging technology are driven by ever-increasing needs for achieving better performance, greater miniaturization and higher reliability. New packaging technology has to further provide for the possibilities of batch production for the purpose of large-scale manufacturing thereby allowing economy of scale.

One specific form of CSP is wafer level packaging (WLP). WLP adopts an area-array packaging approach that is utilized in BGA packaging. This approach enables WLP to have a packaging outline that is substantially identical in size to the IC chip, making WLP the smallest form of CSP. WLP allows the IC packaging process to be carried out at wafer level as well as incorporate wafer level reliability and facilitate IC burn-in tests. Wafer level packaging has therefore attracted immense interest in the electronics industry for being a potential solution in IC packaging process that can provide low-cost production through large-scale manufacturing.

One current WLP manufacturing method is "Re-distribution Layer and Bump" manufacturing. In Re-distribution Layer and Bump manufacturing, a multi-layer thin-film metal rerouting and interconnection system is deposited to each device on the wafer. This additional level of interconnection redistributes the peripheral bonding pads of each chip to an area array of underbump metal pads that are evenly deployed over the chip's surface. The solder balls or bumps used in connecting the device to the application circuit board are subsequently placed over these underbump metal pads.

Application of the rerouting and interconnection system is typically achieved using the standard photolithography and thin film deposition techniques employed in the device fabrication itself. That is, a spin-on deposition technique is typically used to deposit a benzocyclobutene (BCB) or polyimide material and form the re-distribution layers. Deposition of the re-distribution layers via a spin-on application process, however, has inherent limitations in regards to the structure and functionality of the resulting WLP that is produced. For example, the formation of spin-on layers on the silicon wafer imparts stress to the silicon wafer, which can result in wafer warpage. To minimize wafer warpage, the number of spin-on layers must be limited to 1 or 2 layers and/or a thicker die than what is preferable must be employed. Also, high temperatures are required to cure spin-on dielectrics, which may not be compatible with all metallurgies. Furthermore, spin-on layers only allow for the redistribution/re-routing of the peripheral bonding pads and do not allow for the incorporation of addition elements into the WLP, such as embedded resistors/capacitors, shielding layers or other micro-electromechanical systems (MEMS).

The stress induced on the silicon wafer also imposes limitations on formation of an input/output (I/O) system on the WLP. That is, because of the stress imparted on the silicon wafer by the spin-on layers, larger and more robust bumps (i.e., solder balls/connections) and an underfill epoxy are needed for formation of the I/O system interconnection. Use of these large solder balls and the underfill epoxy limits the bump density of the I/O system and limits the level of miniaturization of the WLP that is achievable.

Accordingly there is a need for a method for WLP fabrication that allows for the application of multiple re-distribution layers while minimizing stress and warpage of the wafer die. There is a further need for a fabrication method that reduces solder ball/bump pitch and height to allow for greater density in the I/O system interconnect and miniaturization of the WLP.

BRIEF DESCRIPTION OF THE INVENTION

Embodiments of the invention overcome the aforementioned drawbacks by providing a method of WLP fabrication in which a plurality of re-distribution layers are sequentially laminated onto the silicon wafer. The sequentially laminated re-distribution layers reduce stress on the silicon wafer and allow for formation of a high density input/output (I/O) system interconnection on each chip in a wafer.

In accordance with one aspect of the invention, a wafer level package includes a silicon integrated circuit (IC) substrate having a plurality of die pads formed on a top surface thereof and a plurality of polymer laminates comprising separate pre-formed laminate sheets positioned on the silicon IC substrate, each of the plurality of polymer laminates having a plurality of vias formed therein, with each of the plurality of vias corresponding to a respective die pad. The wafer level package also includes a plurality of metal interconnects formed on each of the plurality of polymer laminates, each of the plurality of metal interconnects covering a portion of a top surface of a respective polymer laminate and extending down through the via and into contact with a metal interconnect on a neighboring polymer laminate positioned below. The wafer level package further includes an input/output (I/O) system interconnect positioned on a top surface of the wafer level package and attached to the plurality of metal interconnects.

In accordance with another aspect of the invention, a method of forming a wafer level package includes the steps of providing a silicon wafer having an integrated circuit (IC) thereon and a plurality of die pads formed on a top surface thereof, adhering a base polymer laminate layer to the top surface of the silicon wafer, and forming a plurality of vias through the base polymer laminate layer, each of the plurality of vias extending down to a respective one of the plurality of die pads. The method also includes the steps of forming a plurality of metal interconnects on the base polymer laminate layer such that each of the plurality of metal interconnects extends down through a respective via to electrically connect to a respective die pad and adding at least one additional polymer laminate layer over the base polymer laminate layer and the metal interconnects. The method further includes the steps of attaching a plurality of input/output (I/O) connections to the metal interconnects on a topmost polymer laminate layer and singulating the silicon wafer into a plurality of wafer level packages, each wafer level package including a portion of the plurality of metal interconnects and a portion of the plurality of I/O connections thereon.

In accordance with yet another aspect of the invention, a method for manufacturing a wafer level package includes providing a silicon wafer having a plurality of die pads formed on a top surface thereof and sequentially laminating a plurality of re-distribution layers over the top surface of the silicon wafer, each of the plurality of re-distribution layers having a plurality of metal interconnects therein. The method also includes attaching a plurality of input/output (I/O) interconnect system to the metal interconnects on a topmost re-distribution layer and singulating the silicon wafer into a plurality of wafer level packages, each wafer level package including a subset of the plurality of metal interconnects and a subset of the plurality of I/O connects thereon.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

The present invention provides for a method of forming a wafer level package (WLP) or wafer level chip size package. The WLP is formed by the application of laminate layers to a silicon wafer and the performing of subsequent drilling, metallization, and etching/patterning, to each layer.

Figure 1:
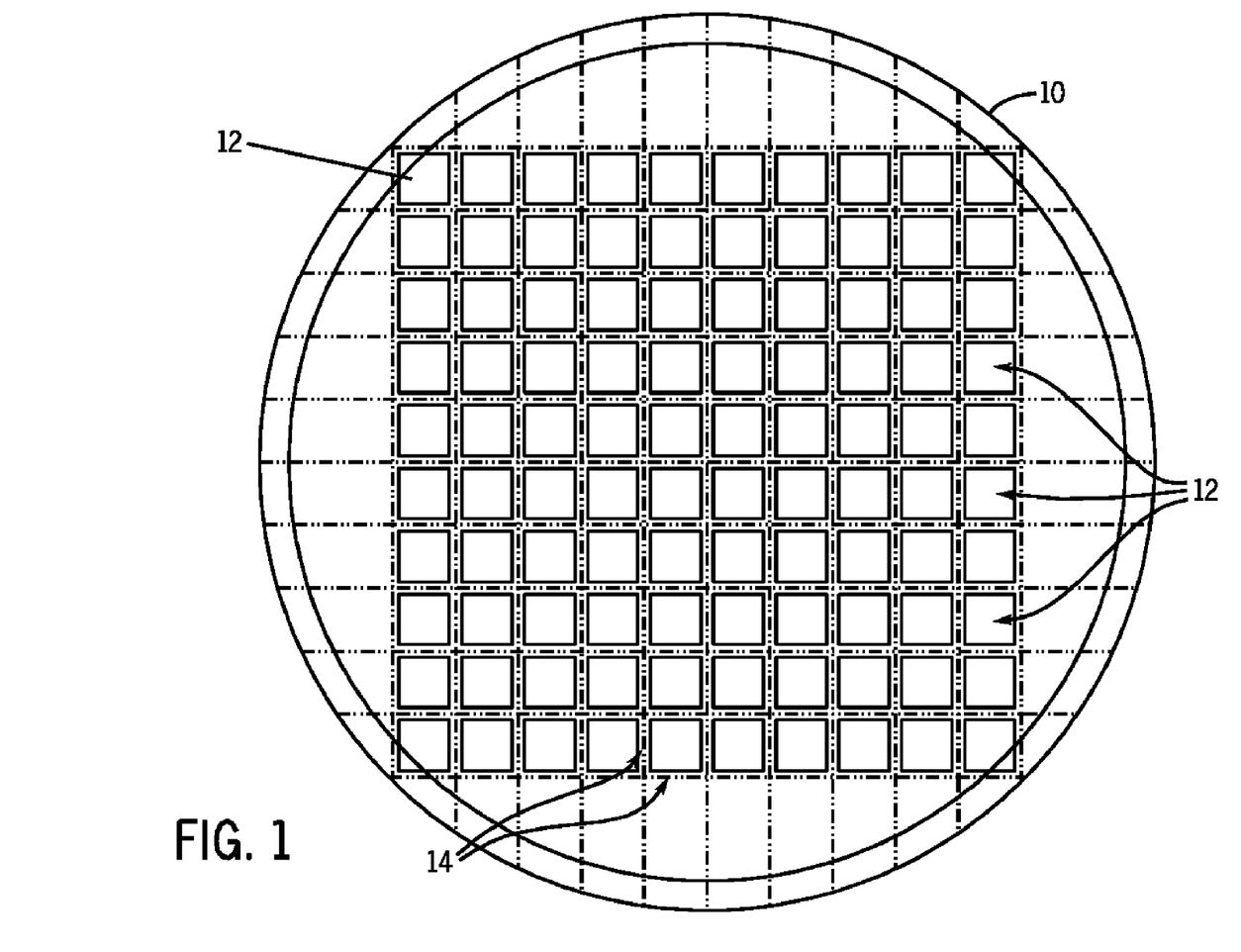
FIG. 1 is a top view of a silicon wafer comprised of wafer level packages according to an embodiment of the invention.

Referring to FIG. 1, a wafer 10 is shown as being divided into a plurality of wafer level packages (WLPs) or dies 12 (i.e., wafer scale packages). The wafer 10 generally is sliced from monosilicon crystal ingot or polysilicon crystal ingot and prepared such that an integrated circuit layout is formed on its surface. The wafer 10, having IC's formed thereon, comprises a plurality of WLPs 12 and includes a dice area 14 between each of the WLPs 12 that is reserved for cutting the wafer 10 into a plurality of individual WLPs 12 or dies.

Figures 2, 3:
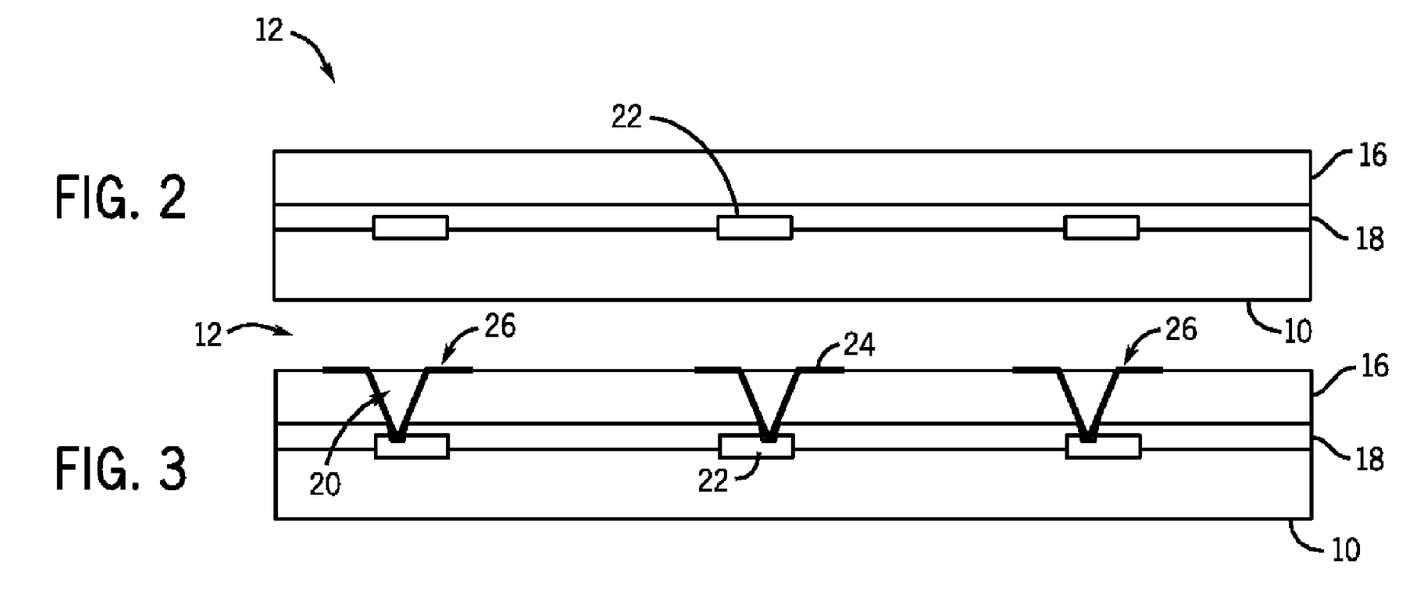
FIG. 2 is a cross sectional view of a wafer level package having a re-distribution layer laminated thereon according to an embodiment of the invention.
FIG. 3 is a cross sectional view of a wafer level package having vias and metal interconnects formed therein according to an embodiment of the invention.

As shown in FIG. 2, in manufacturing a WLP 12, a base polymer laminate layer 16 is applied to silicon wafer 10 by way of an adhesive material 18 applied therebetween. The base polymer laminate layer 16 is in the form of a pre-formed laminate sheet or film that can be placed on silicon wafer 10, as opposed to a layer that is formed/applied by way of a spin-on technique as is used in the prior art. The base polymer laminate 16 can be formed of Kapton®, Ultem®, polytetrafluoroethylene (PTFE), or another polymer film, such as a liquid crystal polymer (LCP). Referring now to FIG. 3, upon application of base polymer laminate layer 16 to silicon wafer 10, a plurality of vias 20 are formed in the laminate layer. The vias 20 are formed by way of a laser ablation or laser drilling process and are formed at positions corresponding to die pads 22 located on silicon wafer 10. Laser drilling of vias 20 in base polymer laminate layer 16 thus serves to expose the die pads 22.

Upon formation of vias 20, a metal layer/material 24 is applied onto base polymer laminate layer 16 by way of, for example, a sputtering or electroplating process. The deposited metal layer/material 24 is then formed into metal interconnects 26. In one exemplary technique, metal layer/material 24 is patterned and etched such that metal interconnects 26 are formed that extend from a top surface 28 of base polymer laminate layer 16 and down through vias 20. Metal interconnects 26 thus form an electrical connection with die pads 22. In this manner, base polymer laminate layer 16 forms a re-distribution layer that acts to redistribute the arrangement of die pads 22, which may (for example) be arranged about a periphery of each WLP 12, into an area array of interconnects distributed over the WLP's surface, as will be explained in greater detail below.

Figure 4:
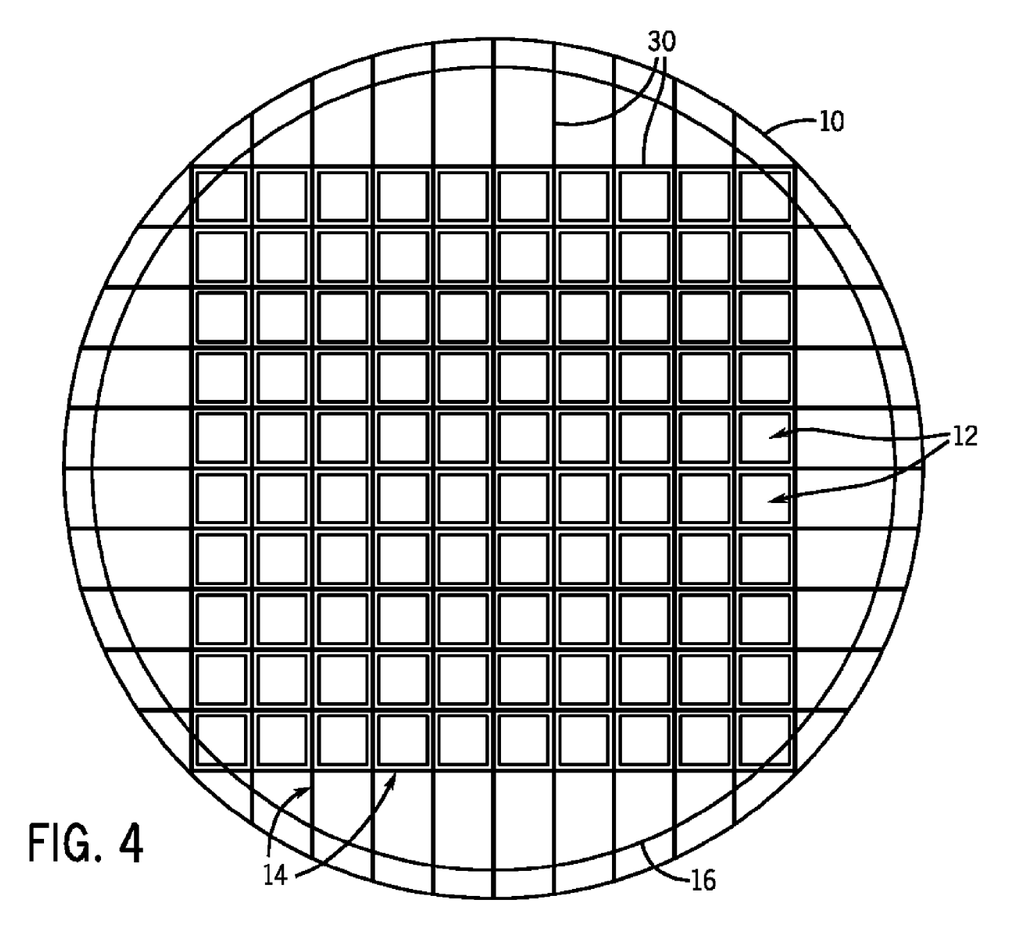
FIG. 4 is a top view of a silicon wafer having a re-distribution layer applied thereon and having trenches formed between wafer level packages according to an embodiment of the invention.

Referring now to FIG. 4, a top view of silicon wafer 10 with the applied polymer laminate and metal interconnects 26 is shown. During manufacturing of the WLPs, and upon lamination of the polymer laminate layer 16 onto silicon wafer 10, a step is performed for removing/reducing residual stress in the wafer. That is, in order to reduce or remove residual stress that may be applied to silicon wafer 10 by the lamination of the polymer laminate layer 16 thereon, excess polymer material is removed from dice area 14 between each of the WLPs 12. The polymer material is removed by way of, for example, forming a plurality of trenches 30 (i.e., scribe streets) in the dice area 14 via a laser ablating or dice sawing process. The trenches 30 can be in the range of 100 micrometers. Formation of trenches 30 helps prevent bowing and warpage in the silicon wafer 10 upon subsequent application of additional polymer re-distribution layers.

Figure 5:
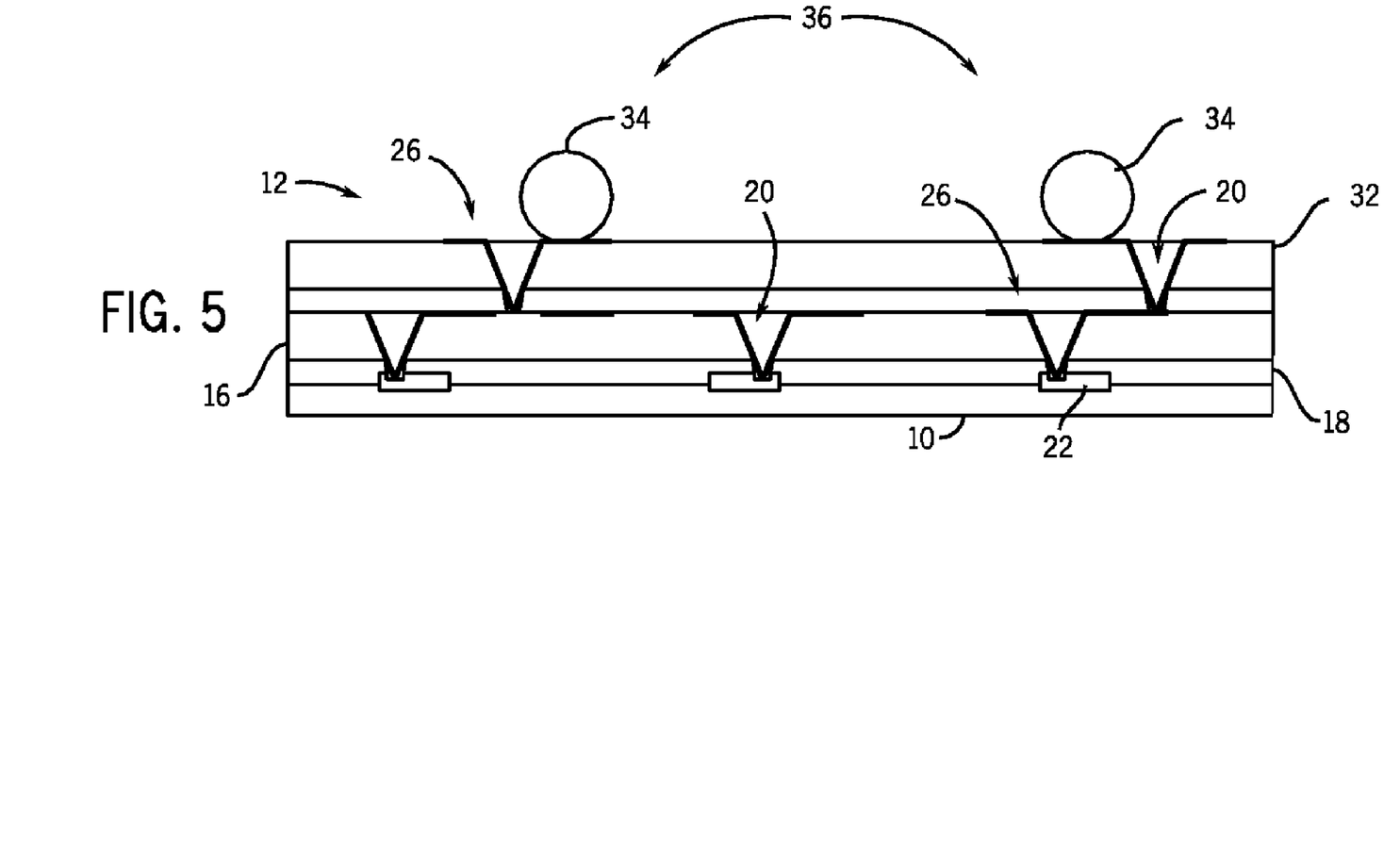
FIG. 5 is a cross sectional view of a sequentially laminated wafer level package having an input/output system interconnect formed thereon according to an embodiment of the invention.

As shown in FIG. 5, upon removal of excess polymer material from dice area, one or more additional polymer laminate layers 32 are applied on base polymer laminate layer 16. Similar to the steps set forth above, a plurality of vias 20 are formed in the additional polymer laminate layers 32 by way of, for example, a laser ablation or laser drilling process. The vias 20 in each of the additional polymer laminate layers 32 are formed at positions corresponding to metal interconnects 26 attached to a polymer laminate layer (e.g., base polymer laminate layer 16) positioned immediately therebelow so as to allow for the further re-distribution of the metal interconnects 26. As further set forth above, metal interconnects are then again formed on the additional polymer laminate layer 32 via a deposition (e.g., sputtering or electroplating) process and subsequent patterning and etching process, so as to deform metal interconnects 26 to extend down through vias 20 and into electrical contact with metal interconnects 26 on the polymer laminate layer 16 positioned immediately therebelow.

Referring still to FIG. 5, after a desired number of additional polymer laminate layers 32 have been applied to silicon wafer 10, a plurality of input/output (I/O) interconnections 34 are applied to metal interconnects 26 on a topmost polymer laminate layer to form an I/O system interconnection 36. In one embodiment, I/O interconnections 34 are formed as balls that are soldered to metal interconnects 26 (i.e., solder balls). It is also envisioned, however, that other forms of I/O interconnections 34 can be attached, such as plated bumps, pillar bumps, gold stud bumps, metal filled polymer bumps, or wirebond connections/pads, such that a reliable connection can be formed between the WLP 12 and a motherboard (not shown) to which it is to be attached.

The re-distribution of metal interconnects 26 provided by the sequential application of a plurality of polymer laminate layers 16, 32 allows for an increased number of I/O interconnections 34 to be formed on a top surface of WLP 12. That is, for example, solder connections 34 can be more densely packed on WLP 12 due to the re-distribution of metal interconnects 26. Solder connections 34 on WLP 12 are thus formed having a decreased pitch and height as compared to conventional solder balls. For example, solder connections 34 can be formed to have a height of 180 micrometers and a pitch of 80 micrometers. The formation of solder connections 34 at such a size on a flexible polymer laminated layer lowers connection joint stress between the WLP 12 and a motherboard (not shown) to which it is to be mounted, thus also negating the need for an under-filling epoxy mixture that would be applied between the solder connections 34, WLP, and a motherboard after soldering of the WLP to the motherboard, as is typically performed in the prior art.

Figure 6:
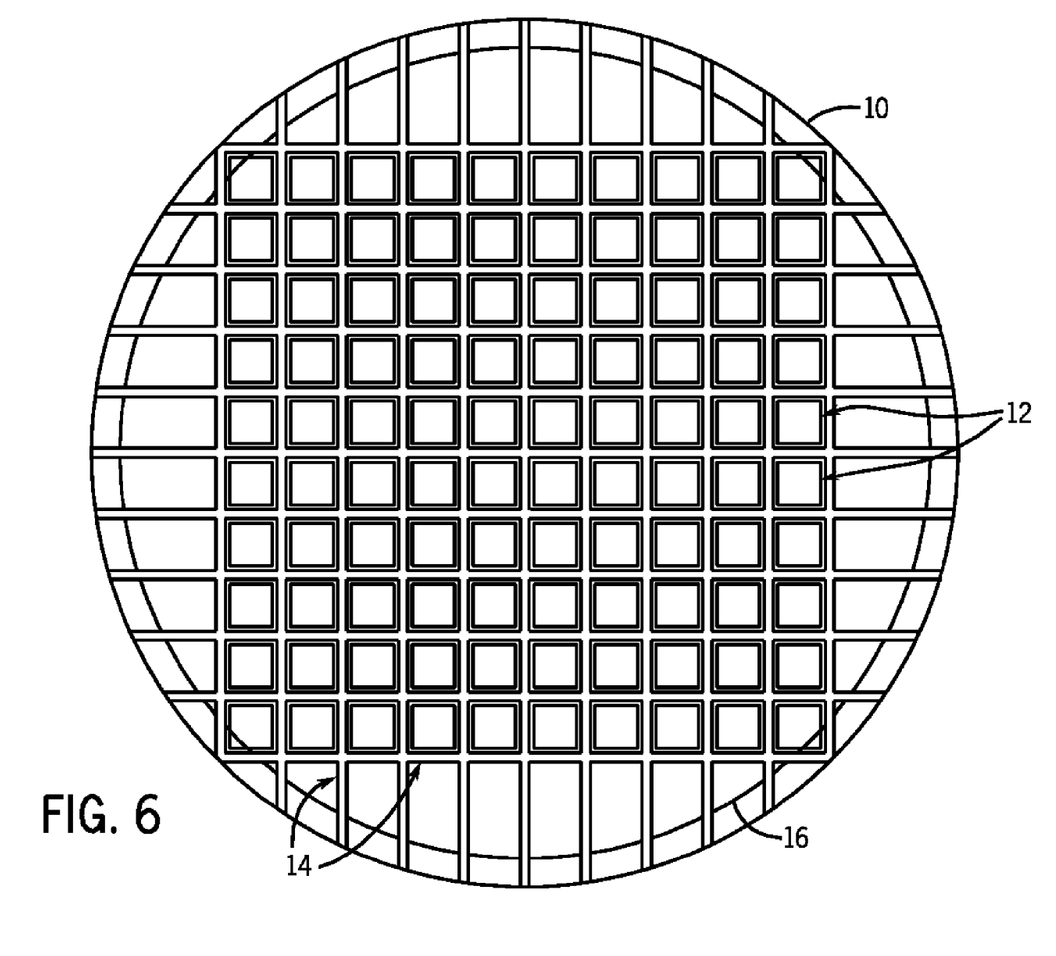
FIG. 6 is a top view of a sequentially laminated silicon wafer singulated into individual wafer level packages according to an embodiment of the invention.

As is further shown in FIG. 5, it is also envisioned that silicon wafer 10 can be back-ground to reduce a thickness thereof. The plurality of polymer laminate layers 16, 32 provides sufficient support for such a back-grinding process, as compared to spin-on layers that would not provide sufficient strength for back-grinding to be performed. Back grinding of silicon wafer 10 allows for the depth/thickness of WLP 12 to be reduced, allowing for further miniaturization of the WLP 12. Upon back-grinding of silicon wafer 10 to a desired thickness, the silicon wafer 10 can be cut so as to singulate the wafer into a plurality of individual WLPs 12, as shown in FIG. 6.

Figure 7:
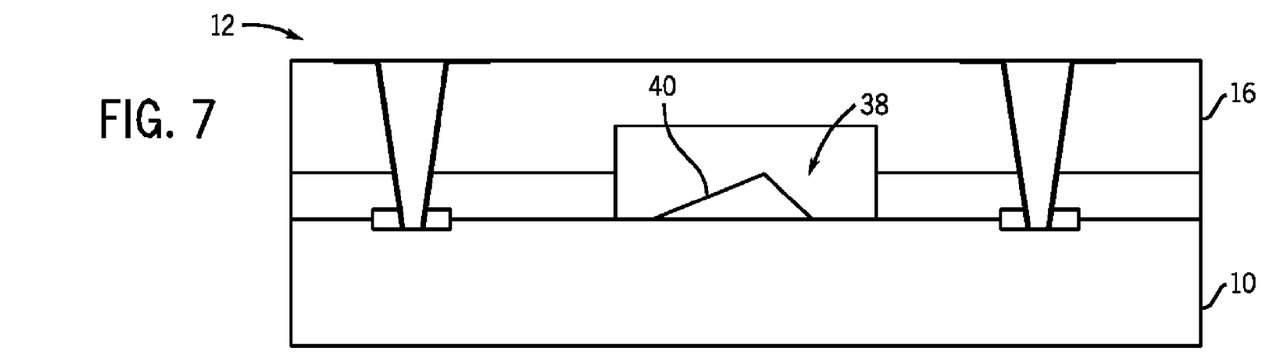
FIG. 7 is a cross sectional view of a sequentially laminated wafer level package having a having a cavity formed therein according to another embodiment of the invention.

In another beneficial improvement provided by the manufacturing process of the invention, it is envisioned that greater functionality can be provided to WLP 12 by way of additional elements that may be integrated therein. That is, the plurality of sequential laminations 16, 32 applied to silicon wafer 10 to form WLP 12 can allow for not only re-distribution of the die pads in WLP 12, but can also allow for the integration of a plurality of devices therein. Referring to FIG. 7, in one embodiment, a cavity 38 can be formed between adjacent polymer laminate layers 16, 32 so as to allow for the positioning of one or more micro-structures 40 therein, such as an air bridge and/or micro-electromechanical system (MEMS). The cavity 38 provides protection to micro-structure 40 to, thus increasing the longevity thereof and improving the reliability of WLP 12.

Figure 8:
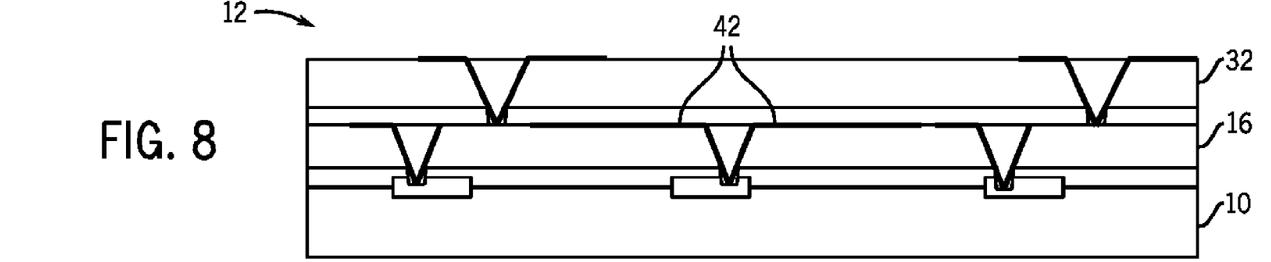
FIG. 8 is a cross sectional view of a sequentially laminated wafer level package having embedded passives included therein according to another embodiment of the invention.
Figure 9:
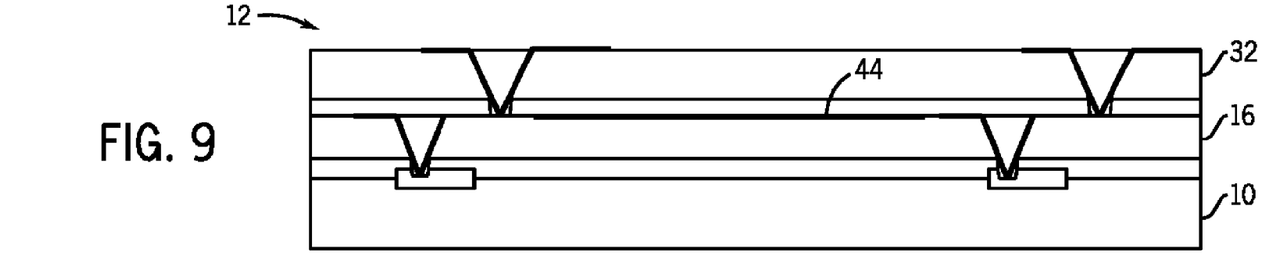
FIG. 9 is a cross sectional view of a sequentially laminated wafer level package having a metal shield included therein according to another embodiment of the invention.

In another embodiment, and as shown in FIG. 8, it is recognized that embedded passives 42, such as thin film resistors, capacitors, or inductors, can also be integrated into WLP 12. That is, an embedded passive 42 can be applied between adjacent (i.e., neighboring) polymer laminate layers 16, 32 during a separate metallization process, to provide further functionality in WLP 12. In yet another embodiment, FIG. 9 shows the inclusion of a metallic shielding element 44 between adjacent polymer laminate layers 16, 32. Shielding element 44 can provide for radio frequency (RF) or electromagnetic interference (EMI) shielding in WLP 12. Application of the micro-electronic devices shown in FIGS. 7-9 are made possible by the sequential lamination of layers 16, 32 onto silicon wafer 10, and is thus differentiated from the conventional spin-on application of layers on the silicon wafer, in which integration of such micro-electronic devices is not possible.

Figure 10:
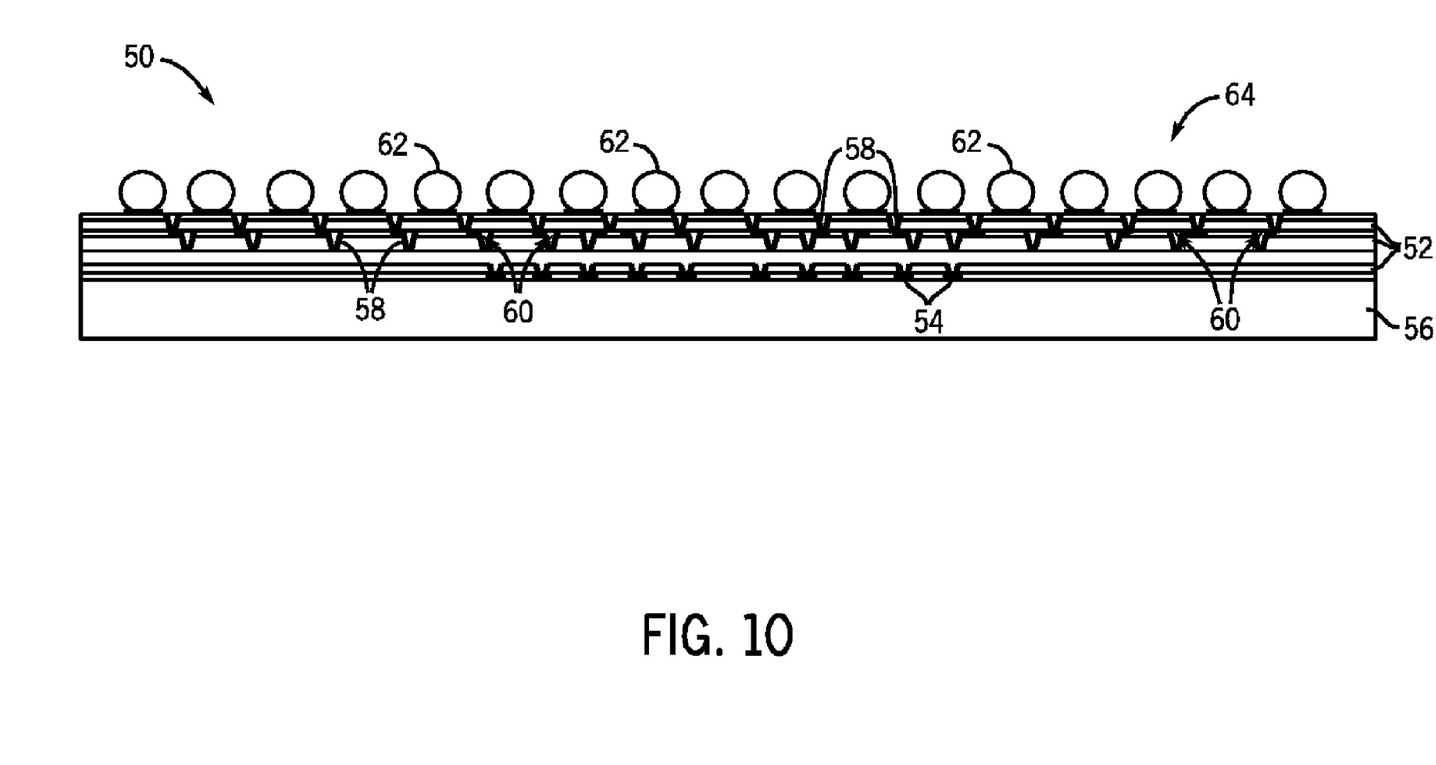
FIG. 10 is a cross sectional view of a completed sequentially laminated wafer level package according to another embodiment of the invention.

Referring now to FIG. 10, a completed WLP 50 is shown. WLP 50 is shown as including a plurality of re-distribution layers 52 therein. While shown as comprising three re-distribution layers 52, it is envisioned that additional layers can be applied such that, for example, WLP 50 includes five or six re-distribution layers 52 therein. The connections from die pads 54 included on the silicon wafer 56 are re-routed by way of a plurality of metal interconnects 58 formed through each of the re-distribution layers 52. The metal interconnects 58 are formed through vias 60 in the re-distribution layers 52 to electrically connect each of the plurality of re-distribution layers 52. A plurality of solder connections 62 (e.g., solder balls) are applied to metal interconnects 58 on the topmost re-distribution layer 52. The plurality of solder connections 62 form a high density interconnection (HDI) system 64 that allows for miniaturization of the WLP 50 and a lower stress connection between the WLP and a motherboard (not shown).

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

Therefore, according to one embodiment of the invention, a wafer level package includes a silicon integrated circuit (IC) substrate having a plurality of die pads formed on a top surface thereof and a plurality of polymer laminates comprising separate pre-formed laminate sheets positioned on the silicon IC substrate, each of the plurality of polymer laminates having a plurality of vias formed therein, with each of the plurality of vias corresponding to a respective die pad. The wafer level package also includes a plurality of metal interconnects formed on each of the plurality of polymer laminates, each of the plurality of metal interconnects covering a portion of a top surface of a respective polymer laminate and extending down through the via and into contact with a metal interconnect on a neighboring polymer laminate positioned below. The wafer level package further includes an input/output (I/O) system interconnect positioned on a top surface of the wafer level package and attached to the plurality of metal interconnects.

According to another embodiment of the invention, a method of forming a wafer level package includes the steps of providing a silicon wafer having an integrated circuit (IC) thereon and a plurality of die pads formed on a top surface thereof, adhering a base polymer laminate layer to the top surface of the silicon wafer, and forming a plurality of vias through the base polymer laminate layer, each of the plurality of vias extending down to a respective one of the plurality of die pads. The method also includes the steps of forming a plurality of metal interconnects on the base polymer laminate layer such that each of the plurality of metal interconnects extends down through a respective via to electrically connect to a respective die pad and adding at least one additional polymer laminate layer over the base polymer laminate layer and the metal interconnects. The method further includes the steps of attaching a plurality of input/output (I/O) connections to the metal interconnects on a topmost polymer laminate layer and singulating the silicon wafer into a plurality of wafer level packages, each wafer level package including a portion of the plurality of metal interconnects and a portion of the plurality of I/O connections thereon.

According to yet another embodiment of the invention, a method for manufacturing a wafer level package includes providing a silicon wafer having a plurality of die pads formed on a top surface thereof and sequentially laminating a plurality of re-distribution layers over the top surface of the silicon wafer, each of the plurality of re-distribution layers having a plurality of metal interconnects therein. The method also includes attaching a plurality of input/output (I/O) interconnect system to the metal interconnects on a topmost re-distribution layer and singulating the silicon wafer into a plurality of wafer level packages, each wafer level package including a subset of the plurality of metal interconnects and a subset of the plurality of I/O connects thereon.

What is claimed is:

1. A wafer level package comprising:
   an integrated circuit (IC) substrate having a plurality of die pads formed on a top surface thereof;
   a plurality of polymer laminates positioned on the IC substrate, each of the plurality of polymer laminates having a plurality of vias formed therein, each of the plurality of vias corresponding to a respective die pad;
   a plurality of interconnects formed on each of the plurality of polymer laminates, each of the plurality of interconnects covering a portion of a top surface of a respective polymer laminate and extending down through the via and into contact with an interconnect on a neighboring polymer laminate positioned below; and
   an input/output (I/O) system interconnect positioned on a top surface of the wafer level package and attached to the plurality of interconnects;
   wherein each of the plurality of polymer laminates comprises a separate pre-formed laminate sheet; and
   wherein each of the plurality of polymer laminates includes a dice area, with the dice area having at least a portion of polymer material removed therefrom to form a trench that reduces residual stress in the IC substrate.

2. The wafer level package of claim 1 wherein the I/O system interconnect comprises one of a plurality of solder balls, a plurality of plated bumps, a plurality of pillar bumps, a plurality of gold stud bumps, a plurality of metal filled polymer bumps, a plurality of wirebonds, and a plurality of wirebond pads.

3. The wafer level package of claim 1 further comprising a micro-electromechanical system (MEMS) positioned in a cavity formed between neighboring polymer laminates.

4. The wafer level package of claim 1 further comprising one of an embedded resistor and an embedded capacitor positioned between a pair of neighboring polymer laminates.

5. The wafer level package of claim 1 further comprising a metal shield positioned between a pair of neighboring polymer laminates.

6. The wafer level package of claim 1 wherein the IC substrate comprises a die having the plurality of die pads formed on the top surface thereof, and wherein an outline of each of the plurality of polymer laminate layers is substantially identical in size to the die so as to form the wafer level package.

7. A method of forming a wafer level package comprising:
   providing a wafer having an integrated circuit (IC) thereon and a plurality of die pads formed on a top surface thereof;
   adhering a base polymer laminate layer to the top surface of the wafer;
   forming a plurality of vias through the base polymer laminate layer, each of the plurality of vias extending down to a respective one of the plurality of die pads;
   forming a plurality of interconnects on the base polymer laminate layer such that each of the plurality of interconnects extends down through a respective via to electrically connect to a respective die pad;
   adding at least one additional polymer laminate layer over the base polymer laminate layer and the interconnects;
   attaching a plurality of input/output (I/O) connections to the interconnects on a topmost polymer laminate layer; and
   singulating the wafer into a plurality of wafer level packages, each wafer level package including a portion of the plurality of interconnects and a portion of the plurality of I/O connections thereon;
   wherein the method further comprises forming a plurality of trenches in the base polymer laminate layer and in each of the at least one additional polymer laminate layers to reduce residual stress in the wafer, the plurality of trenches being formed in a dice area between each of the plurality of wafer level packages and being formed in each respective polymer laminate layer prior to adding each of the additional polymer laminate layers.

8. The method of claim 7 further comprising, for each of the at least one additional polymer laminate layers:
   forming a plurality of vias through the polymer laminate layer, each of the plurality of vias extending to an interconnect on an adjacent polymer laminate layer; and
   forming a plurality of interconnects on the polymer laminate layer such that each of the interconnects extends through the vias to electrically connect to the interconnect on the adjacent polymer laminate layer.

9. The method of claim 7 wherein forming the plurality of trenches comprises one of laser ablating and dice sawing in the dice area between each of the plurality of wafer level packages.

10. The method of claim 7 further comprising back-grinding the wafer to decrease a thickness thereof.

11. The method of claim 7 further comprising forming a cavity between a pair of adjacent polymer laminate layers.

12. The method of claim 7 further comprising positioning at least one of an air bridge and a micro-electromechanical system (MEMS) in the cavity.

13. The method of claim 7 further comprising positioning one of an embedded resistor, an embedded inductor, and an embedded capacitor between a pair of adjacent polymer laminate layers.

14. The method of claim 7 further comprising inserting a metal shield between a pair of adjacent polymer laminate layers.

15. The method of claim 7 wherein attaching a plurality of I/O connections comprises attaching a plurality of solder connections to the interconnects on the topmost polymer laminate layer.

16. The method of claim 7 wherein each singulated wafer level package includes a die formed from a portion of the wafer and includes portions of the base and additional polymer layers corresponding to the die, with a packaging outline of the wafer level package being substantially identical in size to the die.

17. A method for manufacturing a wafer level package comprising:
- providing a wafer having a plurality of die pads formed on a top surface thereof;
- sequentially laminating a plurality of re-distribution layers over the top surface of the wafer, each of the plurality of re-distribution layers having a plurality of interconnects therein;
- attaching a plurality of input/output (I/O) connections to the interconnects on a topmost re-distribution layer; and
- singulating the wafer into a plurality of wafer level packages, each wafer level package including a subset of the plurality of interconnects and a subset of the plurality of I/O connections thereon;
- wherein, during the sequential lamination of the plurality of re-distribution layers, the method further comprises removing material from each of the plurality of re-distribution layers in a dice area between the plurality of wafer level packages, with the material being removed prior to lamination of a next re-distribution layer in the sequential lamination of the plurality of re-distribution layers.

18. The method of claim 17 further comprising:
- forming a plurality of vias through each of the plurality of re-distribution layers; and
- forming the plurality of interconnects such that each of the plurality of interconnects extends down through the vias to electrically connect each of the plurality of re-distribution layers.

19. The method of claim 17 wherein removing material comprises one of laser ablating and dice sawing trenches in each of the plurality of re-distribution layers.

20. The method of claim 17 further comprising back-grinding the wafer to decrease a thickness thereof.

21. The method of claim 17 further comprising:
- forming at least one cavity between a pair of adjacent re-distribution layers in the plurality of re-distribution layers; and
- positioning at least one of an air bridge and a micro-electromechanical system (MEMS) in the cavity.

22. The method of claim 17 further comprising positioning one of an embedded resistor, an embedded inductor, an embedded capacitor, and a metal shield between a pair of adjacent re-distribution layers in the plurality of re-distribution layers.

23. The method of claim 17 wherein each singulated wafer level package includes a die formed from a portion of the wafer and includes a portion of the re-distribution layers corresponding to the die, with a packaging outline of the wafer level package being substantially identical in size to the die.

* * * * *